(12) United States Patent
Namburi et al.

(10) Patent No.: US 7,761,966 B2
(45) Date of Patent: Jul. 27, 2010

(54) METHOD FOR REPAIRING A MICROELECTROMECHANICAL SYSTEM

(75) Inventors: Lakshmikanth Namburi, Duarte, CA (US); Raffi Garabedian, Monrovia, CA (US)

(73) Assignee: Touchdown Technologies, Inc., Baldwin Park, CA (US)

( * ) Notice: Subject to any disclaimer, the term of this patent is extended or adjusted under 35 U.S.C. 154(b) by 0 days.

(21) Appl. No.: 11/778,207

(22) Filed: Jul. 16, 2007

(65) Prior Publication Data

US 2009/0021277 A1 Jan. 22, 2009

(51) Int. Cl.
*B23P 19/04* (2006.01)

(52) U.S. Cl. ............. 29/402.09; 29/402.07; 29/402.08; 29/840; 29/843; 29/860; 438/612

(58) Field of Classification Search ................. 29/840, 29/843, 860, 402.07, 402.08, 402.09; 438/612
See application file for complete search history.

(56) References Cited

U.S. PATENT DOCUMENTS

| 3,806,801 | A | 4/1974 | Bove |
|---|---|---|---|
| 4,161,692 | A | 7/1979 | Tarzwell |
| 4,719,417 | A | 1/1988 | Evans |
| 5,190,637 | A | 3/1993 | Guckel |
| 5,828,226 | A | 10/1998 | Higgins et al. |
| 6,103,399 | A | 8/2000 | Smela et al. |
| 6,121,058 | A | 9/2000 | Shell et al. |
| 6,232,669 | B1 | 5/2001 | Khoury et al. |
| 6,297,164 | B1 * | 10/2001 | Khoury et al. ............. 438/708 |
| 6,426,638 | B1 | 7/2002 | Di Stefano |
| 6,436,802 | B1 * | 8/2002 | Khoury ..................... 438/612 |
| 6,452,407 | B2 * | 9/2002 | Khoury et al. ............. 324/754 |
| 6,520,778 | B1 * | 2/2003 | Eldridge et al. ............. 439/66 |
| 6,523,255 | B2 * | 2/2003 | Shih et al. ..................... 29/843 |
| 6,616,966 | B2 | 9/2003 | Mathieu et al. |
| 6,617,865 | B2 | 9/2003 | Di Stefano |
| 6,727,579 | B1 | 4/2004 | Eldridge et al. |
| 6,736,665 | B2 | 5/2004 | Zhou et al. |
| 6,771,084 | B2 | 8/2004 | Di Stefano |
| 6,777,319 | B2 * | 8/2004 | Grube et al. ................. 438/612 |
| 6,791,176 | B2 | 9/2004 | Mathieu et al. |
| 7,073,254 | B2 | 7/2006 | Eldridge et al. |
| 7,437,813 | B2 * | 10/2008 | Tunaboylu et al. ........ 29/402.13 |
| 2002/0194730 | A1 * | 12/2002 | Shih et al. .................... 29/843 |

OTHER PUBLICATIONS

International Search Report Dated Jun. 20, 2008.

* cited by examiner

*Primary Examiner*—C. J Arbes
(74) *Attorney, Agent, or Firm*—Manuel F. de la Cerra

(57) ABSTRACT

A method for repairing a damaged probe from a probe card comprising the steps of removing the damaged probe from the probe card, separating one a plurality of replacement probes from a substrate and installing the one probe separated from the plurality of replacement probes where the damaged probe was removed.

6 Claims, 8 Drawing Sheets

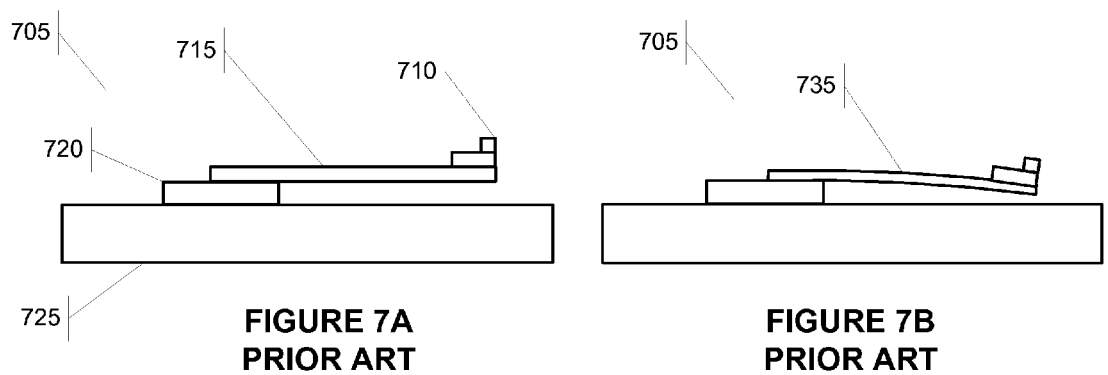
**FIGURE 7A
PRIOR ART**
**FIGURE 7B
PRIOR ART**
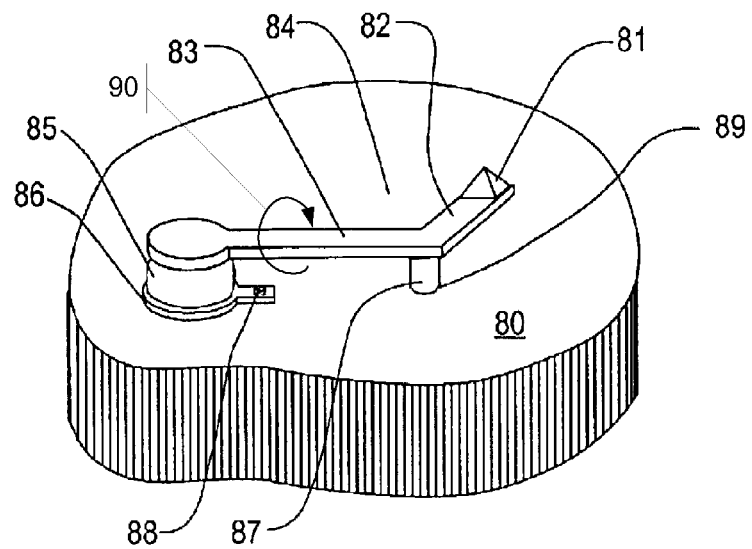
**FIGURE 8
PRIOR ART**

METHOD FOR REPAIRING A MICROELECTROMECHANICAL SYSTEM

1. FIELD OF THE INVENTION

The present invention relates to repairing microelectromechanical systems, including probe cards for use in semiconductor testing.

2. BACKGROUND

Integrated circuits are made in a bulk parallel process by patterning and processing semiconductor wafers. Each wafer contains many identical copies of the same integrated circuit referred to as a "die." It may be preferable to test the semiconductor wafers before the die is cut into individual integrated circuits and packaged for sale. If defects are detected the defective die can be culled before wasting resources packaging a defective part. The individual die can also be tested after they have been cut into individual integrated circuits and packaged.

To test a wafer or an individual die—commonly called the device under test or DUT—a microelectromechanical (termed MEMS) probe card assembly is used which comes into contact with the surface of the DUT. The probe card generally contains three unique characteristics: (1) an XY array of individual probes that move in the Z direction to allow contact with the die pad; (2) an electrical interface to connect the card to a circuit test apparatus; and (3) a rigid reference plane defined in such a way that the probe card can be accurately mounted in the proper location. When the probe card is brought in contact with the die pad, the Z-direction movement allows for a solid contact with the probe tip. The probe card ultimately provides an electrical interface that allows a circuit test apparatus to be temporarily connected to the DUT. This method of die testing is extremely efficient because many die can be tested at the same time. To drive this efficiency even higher, probe card manufactures are making larger probe cards with an ever-increasing numbers of probes.

Currently two types of probe designs are used to test a semiconductor die—cantilever and torsional. FIGS. 7A and 7B illustrate a conventional cantilever probe. The probe (705) comprises a probe tip (710), a bending element (715), and a probe base (720), which is mounted to a substrate (725). This entire structure is referred to herein as the probe card. The entire probe card is generally moved in the Z-direction (depicted by arrow 730) causing the bending element (715) to bend, allowing the probe tip (710) to come into contact with the die pad that is under test. FIG. 7B illustrates how the probe bending element (735) bends while being brought into contact with the die. As an individual probe travels to make contact with the DUT contact pad (this event is called a touchdown), the probe tip scrubs the contact pad, which perfects an electrical contact with the die such that testing can commence. The die contact pads, which are typically aluminum, are often coated with a thin layer of aluminum oxide, or other protective coating, and the probe tip must cut through the coating to perfect the electrical connection. Once testing is complete, the probe (705) is moved away from the die pad and the probe springs back to its original position.

The second type of probe is based on a torsional design. For example, U.S. Pat. No. 6,426,638 describes a torsion spring design. FIG. 8 illustrates a torsional probe design. As the probe tip (81) comes in contact with the DUT contact pad, it moves flexibly in response to force applied vertically to the tip (81). Vertical movement of the tip (81) depresses the arm (82) and torsionally flexes the torsion element (83) in the direction indicated by arrow (90). The torsion element (83) serves as a torsional spring, thereby impressing a restoring force on the tip (81).

These probes, either the torsional or the cantilever, can become damaged and must be replaced. The damage may be from repetitive use. For example, an individual probe may experience thousands of touchdowns and become damaged through ordinary wear and tear. Another possibility is that the probe is defective from the beginning and it breaks prematurely. And yet another possibility is that the probe card is mishandled and the probes are damaged. Regardless of the reason for the damage, it is often advantageous to repair the damaged probe and bring the entire probe card back into service.

To repair a probe card using conventional techniques, the manufacturer of the probe card must first create a new probe, remove the damaged probe from the probe card and install the new probe on the probe card. For example, U.S. Pat. Nos. 5,190,637, 6,436,802, 6,452,407, 6,297,164 and 6,520,778 describe methods for constructing probe structures. U.S. Pat. No. 6,777,319 describes a method of repairing at spring contact by first removing the spring contact by either cutting the spring contact and leaving a stub, or by localized heating that causes the solder to release the spring. U.S. Pat. No. 6,523,255 also describes a method of repairing a damaged probe wire where the damaged probe wire is removed by "pulling on the wire until it fractures at the base of the wire."

These techniques however, have several drawbacks. For example, it may take several weeks to build a new probe. Not only does this cause tremendous inefficiencies by pulling the probe card off the assembly line, but construction of a few replacement probes after the fact can be very expensive. Also, the newly constructed probes will likely not have the same characteristics of the original probes because of variations in manufacturing techniques. This means that the newly replaced probe will likely perform differently than the other probes on the probe card, resulting in potential inefficiencies when the repaired probe card is placed back into service. In addition, the current techniques for removing the damaged probe as described in U.S. Pat. Nos. 6,523,255 and 6,777,319 can be clumsy and can damage other probes in the immediate area.

What is needed, therefore, is a structure and method for repairing MEMS probe cards that is inexpensive, fast and accurate.

3. SUMMARY OF THE INVENTION

A novel device and method for repairing MEMS systems, including probe cards, for use in semiconductor testing is disclosed. In one embodiment, a probe card for use with a diagnostic computer for testing semiconductor wafers comprises a substrate, a plurality of operational probes connected to the substrate, wherein the plurality of operational probes are adapted to make an electrical connection with the diagnostic computer and a plurality of replacement probes connected to the substrate, wherein the plurality of operational probes and the plurality of replacement probes are constructed in substantially the same manufacturing process. In refinements of this embodiment, the manufacturing process may include masking, machining and electroplating until the desired structure is formed. The plurality of operational probes and the plurality of replacement probes may comprise a torsional probe design or a cantilever probe design. Also, the plurality of replacement probes may include a release layer. This release layer may be activated by applying a voltage.

Also disclosed is a novel probe card that can be repaired. Specifically, a probe card for use with a diagnostic computer for testing semiconductor wafers, the probe card comprises a substrate and a plurality of operational probes connected to the substrate, wherein the plurality of operational probes are adapted to make an electrical connection with the diagnostic computer, and wherein the plurality of operational probes includes a sacrificial material that is activated by applying a voltage.

In another embodiment, yet another novel probe card is disclosed. Namely, a probe card for use with a diagnostic computer for testing semiconductor wafers comprising a substrate and a plurality of operational probes connected to the substrate, wherein the plurality of operational probes are adapted to make an electrical connection with the diagnostic computer, and wherein the plurality of operational probes includes a release layer wherein the release layer is activated by applying a voltage.

A method for removing a damaged probe from a probe card is disclosed. The method removes a damaged probe from a probe card that includes a plurality of operational probes connected to a substrate and the plurality of operational probes comprises the damaged probe and a sacrificial material which is activated by applying a voltage. The method comprises identifying the damaged probe, applying the voltage to the damaged probe, exposing the damaged probe to an etching solution and removing the damaged probe from the probe card. In refinements of this embodiment, the probe card can further comprise a plurality of replacement probes connected to the substrate, wherein the plurality of operational probes and the plurality of replacement probes are constructed in substantially the same manufacturing process, and the method may further include the steps of separating one of the plurality of replacement probes from the substrate, and installing the separated one probe where the damaged probe was removed. The step of separating the one probe from the plurality of replacement probes may include mechanically mechanical plucking, mechanical shearing, laser cutting, voltage-activated etching, sacrificial layer etching and combinations thereof. The plurality of probes on the probe card used with this method may further comprise a release layer that is activated by applying a second voltage, and the step of separating the one probe from the plurality of replacement probes may further include applying the second voltage to the one probe and exposing the one probe to a second etching solution. Also, the separation of the one probe from the plurality of replacement probes may be performed before the probe card is placed into service. Finally, the step of installing the separated one probe may be performed using a die bonder or other suitable means.

A method for repairing a damaged probe from a probe card is also disclosed. The method repairs a damaged probe from a probe card which includes a plurality of operational probes connected to a substrate and a plurality of replacement probes connected to the substrate and wherein the plurality of operational probes and the plurality of replacement probes are constructed in substantially the same manufacturing process. The method comprising the steps of identifying the damaged operational probe, removing the damaged operational probe from the probe card, separating one of the plurality of replacement probes from the substrate, and installing the one probe separated from the plurality of replacement probes where the damaged operational probe was removed. In refinements of this embodiment, the plurality of replacement probes comprises a release layer that is activated by applying a voltage, and the step of separating the one probe from the plurality of replacement probes further includes applying the voltage to the one probe and exposing the one probe to an etching solution. Also the step of separating the one probe from the plurality of replacement probes may be performed by mechanical plucking, mechanical shearing, laser cutting, voltage-activated etching, sacrificial layer etching and combinations thereof, and may be performed before the probe card is placed into service. The step of installing the separated one probe may be performed using a die bonder or other suitable means. Finally, the step of removing the damaged operational probe may be accomplished by mechanical plucking, mechanical shearing, laser cutting, voltage-activated etching and combinations thereof.

4. BRIEF DESCRIPTION OF THE DRAWINGS

FIGS. 7A & 7B are illustrations of a prior art probe that employs a cantilever design.

FIG. 8 is an illustration of a prior art probe that employs a torsional design.

5. DETAILED DESCRIPTION

Figure 1A:
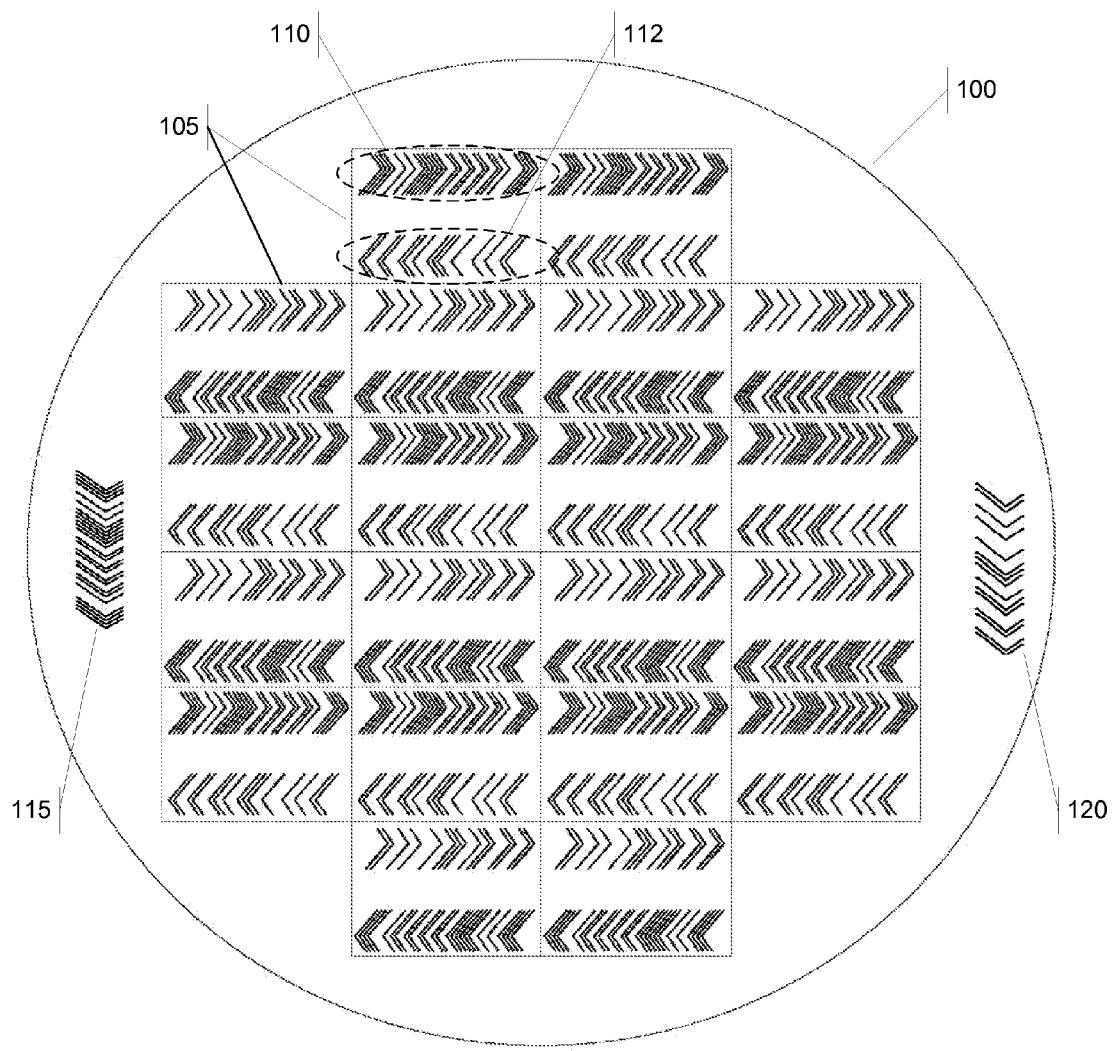
FIG. 1A depicts a novel probe card with both a plurality of operational probes and a plurality of replacement probes.

A novel device and method for repairing MEMS systems, including probe cards for use in semiconductor testing is disclosed. FIG. 1A illustrates a probe card (100) that contains twenty single die probe areas (105) allowing it to test twenty die simultaneously. Each die probe area (105) contains a plurality of operational probes (110 and 112) that can be connected to a diagnostic computer to test the individual die. During the manufacture of the probe card, an additional plurality of replacement probes (115 and 120) is manufactured. The term operational probe is used to describe probes that are intended to be used in testing a die, while a replacement probe is a probe that may later be used to repair any damaged replacement probe. Of course, if a replacement probe is used to repair a damaged operational probe, then that replacement probe becomes an operational probe for use in testing the die.

The manufacture of this novel probe card may be accomplished by several methods and may include multiple levels of photolithography (or X-ray lithography) with sacrificial layers. For example, U.S. Pat. No. 5,190,637 describes a method of using multiple mask exposures which are capable of producing substantially arbitrary three-dimensional shapes. First, a plating base on a surface of a substrate is provided, and a photoresist layer is applied to the plating base. The photoresist is exposed in a pattern to radiation to render the photoresist dissolvable in the exposed pattern (i.e., the mask). The photoresist is removed and a first layer of metal is electroplated onto the plating base in the area from which the photoresist has been removed. Then the remainder of the photoresist is removed. A first layer of secondary metal is electroplated onto the plating base to cover and surround the first layer of the primary metal. The secondary metal is chosen so that it can be differentially etched without substantially etching the primary metal. And the exposed surface of the secondary metal is machined down to a flat surface to a selected height which exposes the first layer of the primary metal. The process of masking, machining and electroplating can be repeated until the desired structure is formed. Other methods would be apparent to one skilled in the art, including those disclosed in U.S. Pat. Nos. 6,436,802, 6,452,407, 6,297,164 and 6,520,778.

Using the process described in U.S. Pat. No. 5,190,637, the probe structures are built layer by layer until the probe structure is complete. Both the plurality of operational probes and replacement probes may be manufactured in the same manufacturing steps. For example, the probe base for both the operational probes and the replacement probes may be constructed in the same layer. Similarly the probe bending element in a cantilever design, or torsion element in a torsional design, may be constructed in the same layer.

Figure 1B:
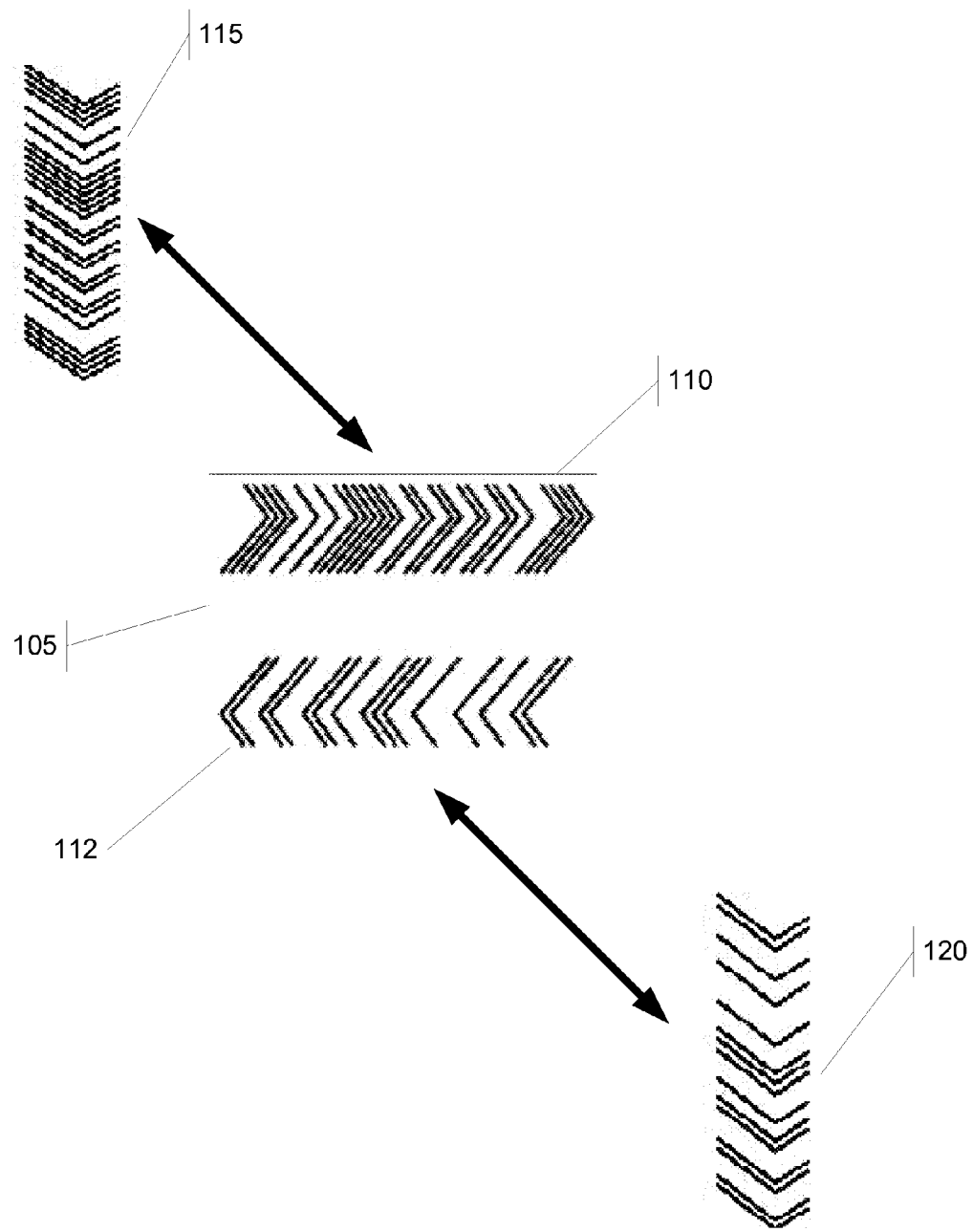
FIG. 1B depicts the plurality of replacement probes and the plurality of operational probes in higher magnification than in FIG. 1.

In addition, the replacement probes (115 and 120) may have the same design as the operational probes. Specifically, FIG. 1B illustrates a single die probe area (105) which contains a plurality of operational probes (110 and 112) that can be connected to a diagnostic computer to test the individual die. Also shown is a plurality of replacement probes (115 and 120). The design of replacement probes (115) is identical to the design of operational probes (110), while the design of replacement probes (120) is identical to that of operational probes (112).

After the probe card is manufactured, the replacement probes may be separated from the wafer substrate. This may be done prior to placing the probe card into service, in which case the probes are stored for use in the future. Alternatively, the replacement probes may be separated after the card is placed into use. Also, all of the replacement probes may be removed or just a sufficient number needed to implement a repair.

Figure 2A:
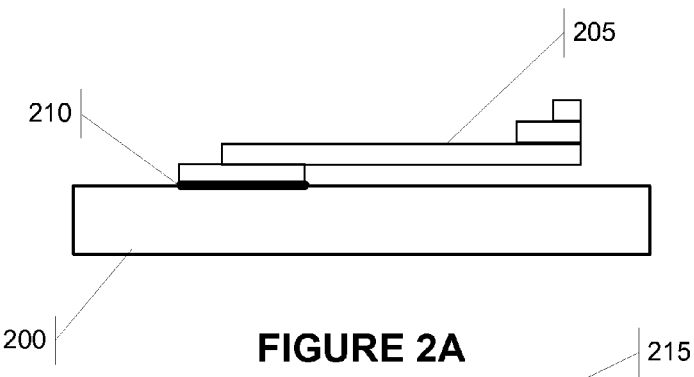
FIGS. 2A & 2B illustrate a novel cantilever probe structure with a release layer.
Figure 2B:
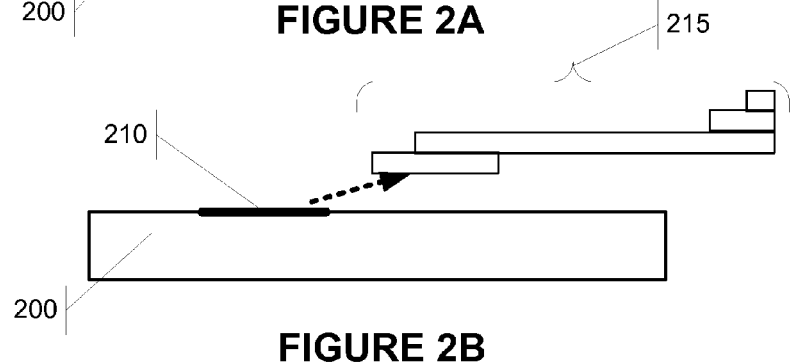
Figure 2C:
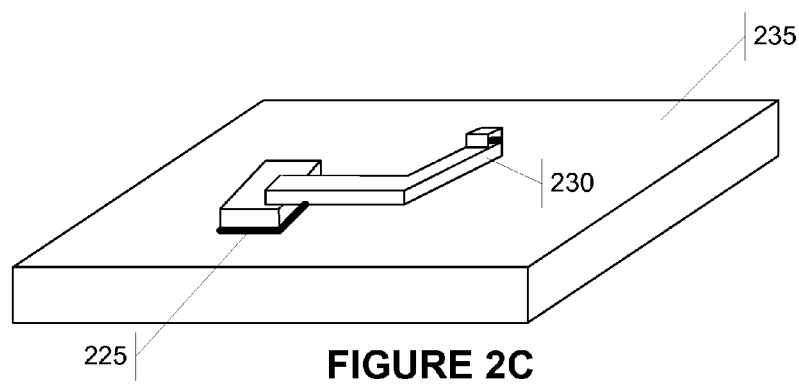
FIGS. 2C & 2D illustrate a novel torsional probe structure with a release layer.
Figure 2D:
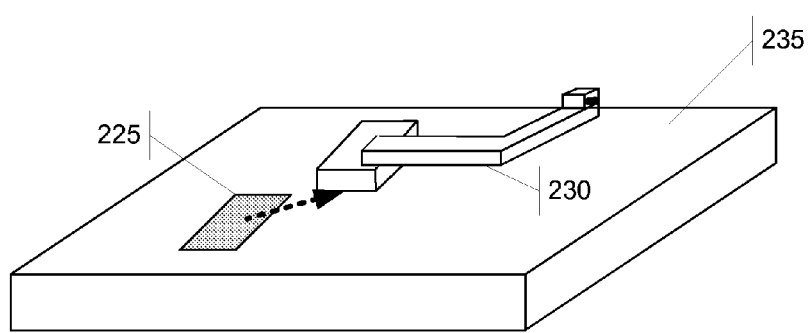

Removing the replacement probe may be accomplished by a number of methods. One such method is illustrated in FIG. 2A. A cantilever probe (205) is shown built upon a substrate (200). The probe (205) contains a release layer (210). As shown in FIG. 2B, the release layer allows the entire replacement probe (215) to be separated from the substrate (200). FIG. 2C shows a release layer (225) as applied to a torsional probe (230). Again, the entire replacement probe (230) can be separated from the substrate (235) using the release layer (225). The release layer may simply be a sacrificial layer that is etched after the replacement probe structure has been constructed. The release layer may also include a sacrificial layer that is activated by using a voltage applied to the layer and an etching solution. See Journal of MicroMechanical Microengineering, 9 (1999) 97-104 entitled *In-situ fabrication of sacrificial layers in electrodeposited NiFe microstructures*. It may be advantageous to construct the novel probe card with an independent electrical connection to the plurality of replacement probes, such that the voltage can be applied preferentially to the replacement probes; thus preferentially causing the release layer to etch away in the solution for only the replacement probes.

The novel probe card with replacement probes has several advantages. First, because the operational probes and replacement probes are made in substantially the same manufacturing process, they will have very similar, if not identical, tolerances. Second, because of the manufacturing process both the replacement and operational probes will have the same, or nearly the same, material properties. Third, the replacement probes and the operational probes will have the same design. Fourth, the cost for the replacement probes is negligible when they are constructed along side of the operational probes. Fifth, the time needed to repair a damaged operational probe is much shorter because a replacement probe is already on hand. And finally, the use of the novel probe will be much more efficient because the time and cost in repairing a damaged operational probe is reduced.

Currently available techniques cannot offer any of these advantages. Under current techniques, the replacement probe is constructed after the original probe card is placed into service. This can take several weeks to construct because the machining must be changed to accommodate the few replacement probes that are needed. Obviously, monopolizing the machining to construct a few replacement probes is very expensive, time consuming and takes the machines off-line from producing other probe cards. Also, producing replacement probes in a separate manufacturing process introduces large variations between the material properties of the undamaged probes and the replacement probe. These material variations can affect the performance of the replacement probe vis-à-vis the undamaged probes. Finally, the tolerances of the replacement probes will vary from that of the undamaged probes. When a probe card is originally manufactured there are misalignments between the various structures that are constructed. But because all the probes are built in the same manufacturing process those misalignments are common to all the probes on the probe card. Because the misalignment is common, each probe will perform substantially the same and the probe card can be adjusted to correct for the misalignments. However, when the replacement probes are constructed in a separate manufacturing process they will not have the misalignments that are common to the undamaged probes. Thus the replacement probes will perform differently than the undamaged probes. A variation in probe performance is generally unacceptable and inefficient. The problem of non-uniform alignment with damaged probes is especially crucial in a torsional probe design which requires three points of alignment: the base, the pivot and the tip.

Figure 3A:
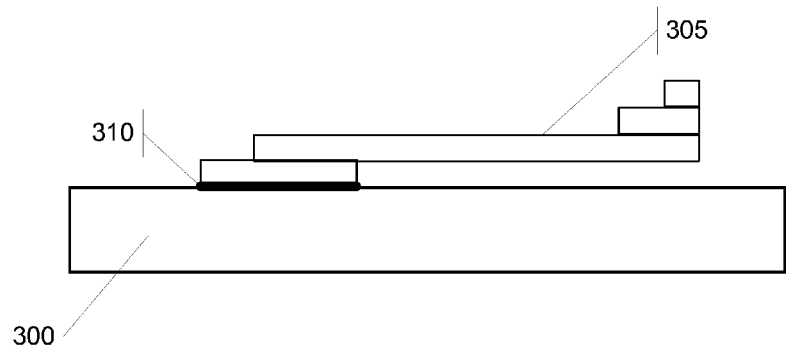
FIG. 3A illustrates a novel probe card design where the cantilever probe base contains a release layer that is voltage activated.

Now a novel probe card that can be repaired is disclosed. Probe cards are highly intricate structures that have several (sometimes thousands) of individual probes, wherein each probe may have an independent electrical connection to a diagnostic computer. Next, a novel probe card that uses this intricate structure is disclosed. Specifically referring to FIG. 3A, a probe card substrate (300) is shown with a cantilever probe (305). The probe (305) contains a release layer (310) that is made of a voltage activated sacrificial material. This type of material is described above. See also Journal of MicroMechanical Microengineering, 9 (1999) 97-104 entitled *In-situ fabrication of sacrificial layers in electrode-*

Figure 3B:
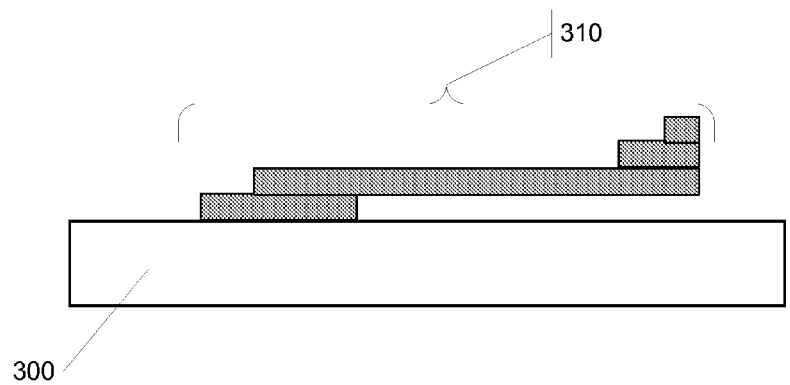
FIG. 3B illustrates a novel probe card design where the entire cantilever probe is made of a sacrificial material that is voltage activated.
Figure 3C:
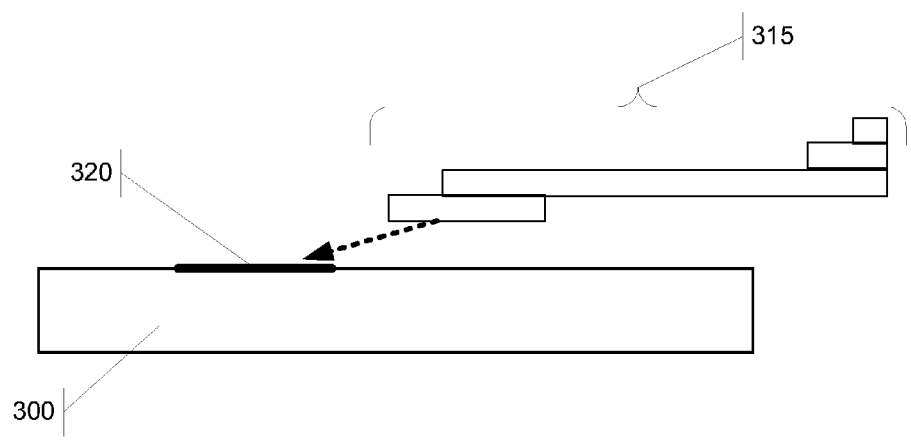
FIG. 3C illustrates a novel probe card design where a damaged probe has been removed and a replacement probe is being installed.

*posited NiFe microstructures.* When a probe is found to be damaged, a voltage is applied to the damage probe and the probe is then exposed to an etching solution. Given that the probe card has independent electrical connections to its various probes, the voltage can be applied preferentially to the damaged probe; thus preferentially causing the release layer to etch away in the solution. Once the release is etched away, the damaged probe is removed from the substrate. FIG. 3B illustrates an embodiment where the entire cantilever probe (310) is constructed of a voltage activated sacrificial material. Once the damaged probe is removed then a replacement probe (315) can be installed. Also, it may be preferable to leave the probe pad (320) intact such that the replacement probe (315) has a place to make a good electrical connection to the probe card (see FIG. 3C). The probe pad (320) is generally made of gold, or other highly conductive material, and would not be etched away in the process just described. It may also be preferable to mechanically shear or pluck, or laser cut a portion of the damaged probe before using the voltage-activated etching material.

Figure 4A:
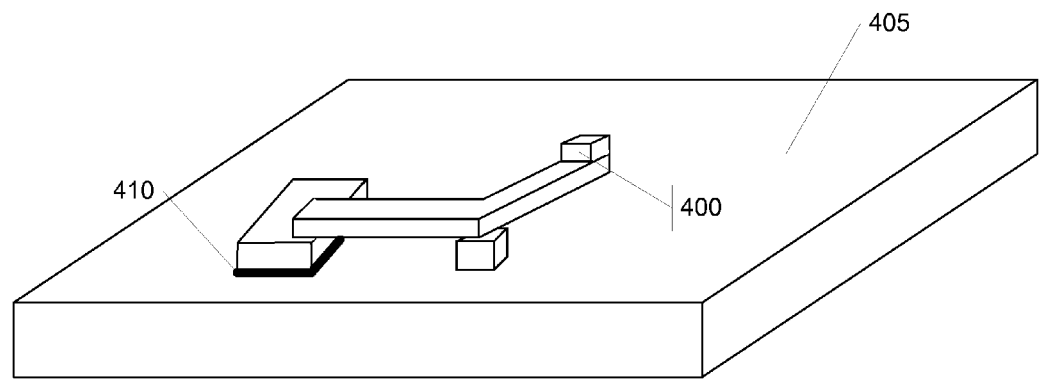
FIG. 4A illustrates a novel probe card design where the torsional probe base contains a release layer that is voltage activated.
Figure 4B:
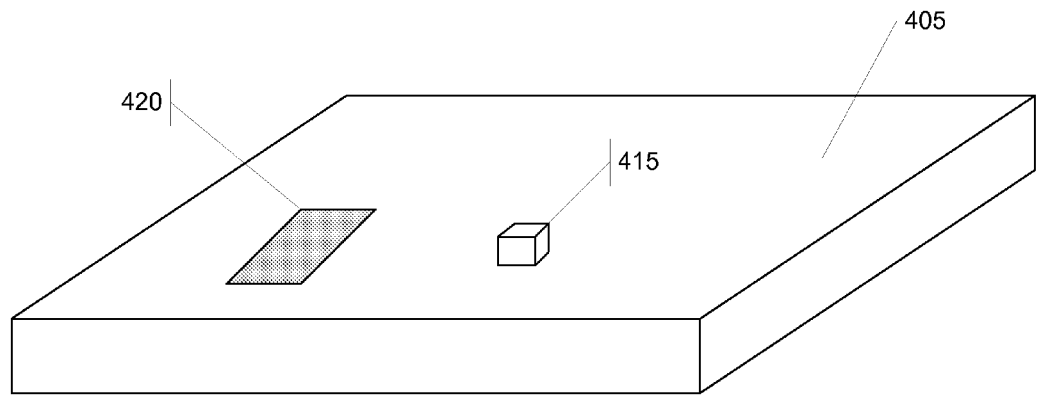
FIG. 4B illustrates a novel probe card design where the damaged torsional probe has been removed, while maintaining the pivot.
Figure 4C:
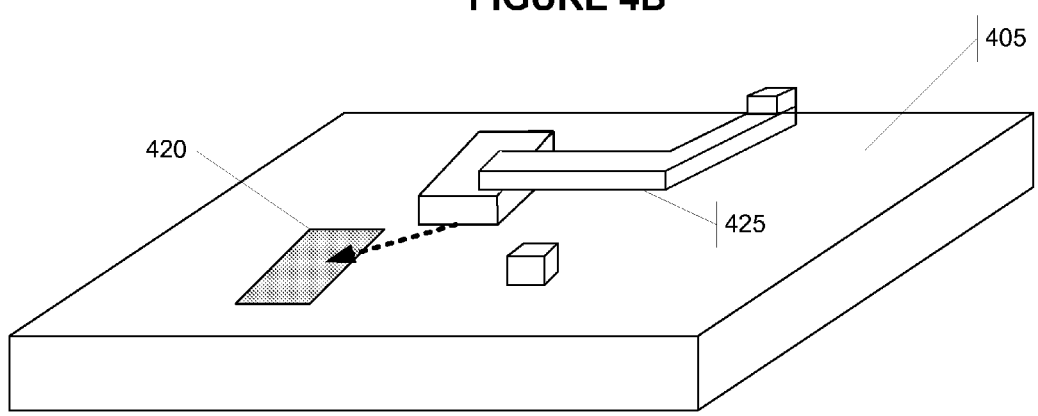
FIG. 4C illustrates a novel probe card design where a damaged probe has been removed and a replacement probe is being installed.

Similar to the cantilever probe design just described, FIGS. 4A-4C illustrate a torsional probe design that can be repaired. FIG. 4A depicts a torsional probe (400) mounted to a substrate (405), wherein the probe base contains a release layer (410). The release layer (410) is made of a voltage activated sacrificial material. This type of material is described above. See also Journal of MicroMechanical Microengineering, 9 (1999) 97-104 entitled *In-situ fabrication of sacrificial layers in electrodeposited NiFe microstructures*. When a probe is found to be damaged, a voltage is applied to the damage probe and the probe is then exposed to an etching solution. Given that the probe card has independent electrical connections to its various probes, the voltage can be applied preferentially to the damage probe; thus preferentially causing the release layer to etch away in the solution. Once the release is etched away, the damaged probe is removed from the substrate. It may also be preferable to mechanically shear or pluck, or laser cut a portion of the damaged probe before using the voltage-activated etching material.

FIG. 4B illustrates the substrate once the probe (400) has been removed. The probe pivot (415) is left intact as well as the probe pad (420) such that the replacement probe (425) has a place to make a good electrical connection to the probe card. In FIG. 4C a replacement probe is installed on the probe pad (420).

Figure 5:
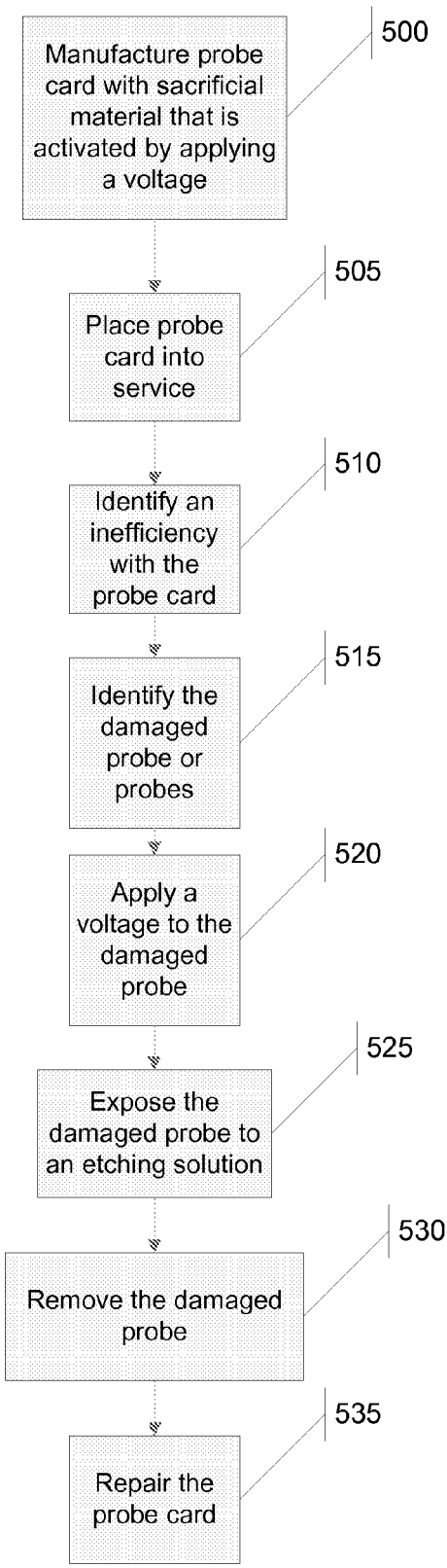
FIG. 5 is a flow chart outlining a novel method for removing a damaged probe.

FIG. 5 charts out a method for removing a damaged probe. First, a probe card with the voltage activated sacrificial material is manufactured (500) and placed into service (505). Such a probe card has been described with reference to FIGS. 3A-4C. Once the probe card is in service, the user may identify a deficiency in the probe card (510). This may be identified by experiencing too many false positives for a certain die probe area. In other words, a particular spot on the probe card is constantly registering a faulty DUT. Or the user may periodically remove the card from the assembly line and perform planarity testing, diagnostic testing and visual inspection. By whatever means the inefficiency is identified, the damaged probe will also be identified (515). Then a voltage is applied to damaged probe (520) and the damaged probe is exposed to an etching solution (525). The damaged probe is then removed from the probe card substrate (530). At this point, the probe card may be repaired (535). One such method for repairing the probe card is described next.

Figure 6:
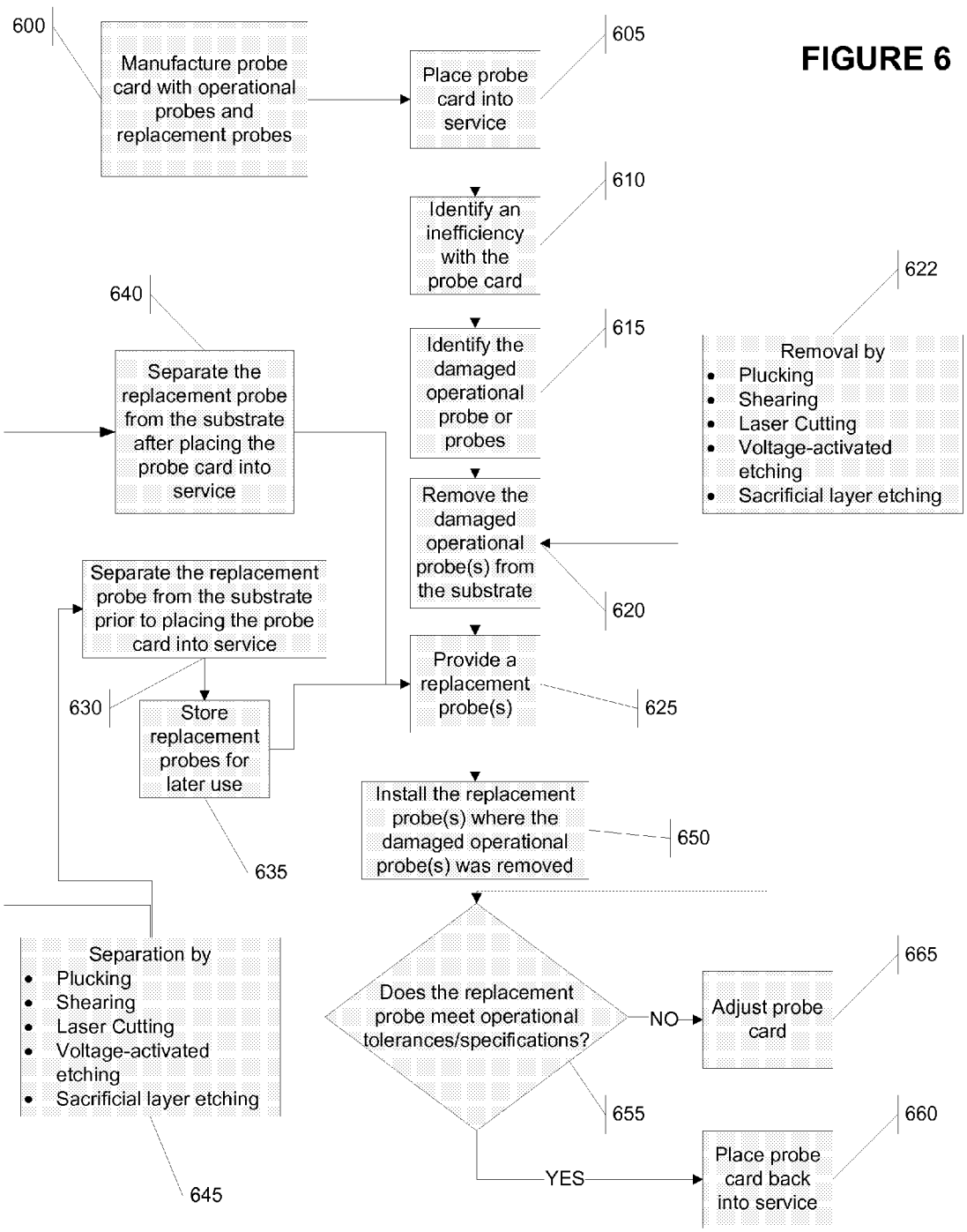
FIG. 6 is a flow chart outlining a novel method for repairing a damaged probe.

Referring now to FIG. 6, a method for repairing a damaged operational probe is disclosed. First, a probe card with the operational probes and replacement probes is manufactured (600) and placed into service (605). Such a probe card has been described above with reference to FIGS. 1A-2D. Once the probe card is in service, the user should identify a deficiency in the probe card (610). This may be identified by experiencing too many false positives for a certain die probe area. In other words, a particular spot on the probe card is constantly registering a faulty DUT. Or the user may periodically remove the card from the assembly line and perform planarity testing, diagnostic testing and visual inspection. By whatever means the inefficiency is identified, the damaged operational probe should also be identified (615). Then the damaged probe must be removed (620). It would be apparent to one of skill in the art that the damaged operational probe may be removed by any suitable means, including but not limited to mechanical plucking, mechanical shearing, laser cutting, voltage-activated etching, sacrificial layer etching and combinations thereof (622). Now that the damaged operational probe has been removed, a replacement probe must be installed. First, a replacement probe must be provided (625). This may be accomplished by separating the replacement probe from the substrate prior to placing the card into service (630) and storing the replacement probe for later use (635). Or the replacement probe may be separated from the substrate after the card has been placed into service (640). It would be apparent to one of skill in the art that the replacement probe may be separated from the substrate in either step 630 or 640 by any suitable means, including but not limited to mechanical plucking, mechanical shearing, laser cutting, voltage-activated etching, sacrificial layer etching and combinations thereof (645). Now the replacement probe may be installed where the damaged operational probe was removed (650). This may be directly on the probe pad. Various suitable means of installing the replacement probe are apparent to those skilled in the art, including but not limited to die bonding. See e.g. Model 860 Eagle Omni Bonder by Semiconductor Equipment Corporation.

One the replacement probe is installed, the replacement probe and possibly the entire probe card is tested to make certain the operational tolerances and specifications are met (655). If the replacement probe/probe card meets the tolerance and specifications, the probe card is placed back into service (660). If not, the probe card is adjusted (665), which may include replacing the replacement probe, until the tolerances and specifications are met.

Having described the methods and structures in detail and by reference to several preferred embodiments thereof, it will be apparent that modifications and variations are possible without departing from the scope of the invention defined in the following claims. Moreover, the applicants expressly do not intend that the following claims "and the embodiments in the specification to be strictly coextensive." *Phillips v. AHW Corp.*, 415 F.3d 1303, 1323 (Fed. Cir. 2005) (en banc).

The invention claimed is:

1. A method for repairing a damaged probe from a probe card, wherein the probe card comprises a substrate, a plurality of operational probes formed on the substrate and a plurality of replacement probes formed on the substrate, wherein the plurality of operational probes and the plurality of replacement probes are formed in substantially the same manufacturing process, the method comprising the steps of:
   (a) identifying the damaged probe;
   (b) removing the damaged probe from the probe card;
   (c) separating one of the plurality of replacement probes from the substrate; and
   (d) installing the one probe separated in step (c) where the damaged probe was removed in step (b).

2. The method of claim 1 wherein the plurality of replacement probes comprises a release layer that is activated by applying a voltage, wherein step (c) of the method further comprises:
(c)(1) applying the voltage to the one probe; and
(c)(2) exposing the one probe to an etching solution.

3. The method of claim 1 wherein method of separation of step (c) is selected from a group consisting of mechanical plucking, mechanical shearing, laser cutting, voltage-activated etching, sacrificial layer etching and combinations thereof.

4. The method of claim 1 wherein step (c) of the method is performed before the probe card is placed into service.

5. The method of claim 1 wherein step (d) of the method is performed using a die bonder.

6. The method of claim 1 wherein the method of removal of step (b) is selected from a group consisting of mechanical plucking, mechanical shearing, laser cutting, voltage-activated etching and combinations thereof.

\* \* \* \* \*